United States Patent [19]

Morimura et al.

[11] Patent Number: 4,630,106

[45] Date of Patent: Dec. 16, 1986

[54] COLOR SOLID-STATE IMAGER WITH COLOR FILTER HAVING AN OVERLAPPING SEGMENTED FILTER ARRANGEMENT

[75] Inventors: Atsushi Morimura, Moriguchi; Hiromichi Tanaka, Hirakata, both of Japan

[73] Assignee: Matsushita Electric Industrial Co., Ltd., Kadoma, Japan

[21] Appl. No.: 463,666

[22] Filed: Feb. 4, 1983

[30] Foreign Application Priority Data

Feb. 15, 1982 [JP] Japan ................................ 57-22325
Apr. 28, 1982 [JP] Japan ................................ 57-72103

[51] Int. Cl.⁴ .......................... H04N 9/077; H04N 9/07
[52] U.S. Cl. .......................................... 358/44; 358/43
[58] Field of Search ............................ 358/44, 41, 43

[56] References Cited

FOREIGN PATENT DOCUMENTS

| 52-52326 | 4/1977 | Japan | 358/44 |
| 55-92089 | 7/1980 | Japan | 358/44 |
| 56-84089 | 7/1981 | Japan | 358/44 |
| 57-4679 | 1/1982 | Japan | 358/44 |
| 58-75394 | 5/1983 | Japan | 358/44 |

Primary Examiner—John W. Shepperd
Assistant Examiner—Randall S. Svihla
Attorney, Agent, or Firm—Cushman, Darby & Cushman

[57] ABSTRACT

A solid state color imaging apparatus includes a solid state image sensor having a plurality of picture elements regularly disposed in a two dimensional pattern along a plurality of horizontal lines. Each horizontal line includes a plurality of picture elements disposed in repetition at a predetermined pitch wherein light incident thereon is converted to a proportional electrical signal. A color filter placed over the picture elements has a plurality of filter elements disposed in regular repetition in horizontal rows and vertical columns. The filter elements are the same kind in each horizontal row scanned sequentially and only the combination is different. When the electric signals are read out from the imaging sensor, each horizontal row of filter elements spatially modulate at least two primary color lights. The mean value of the read out signals is equal and the modulated color signal is the color difference signal. The arrangement of the color filter elements are shown in three different alternative patterns, each for the purpose of attaining high-horizontal resolution, high S/N ratio and simplified signal processing.

6 Claims, 35 Drawing Figures

FIG. 3(b) (Prior Art) n-th line

FIG. 3(c) (Prior Art) (n+1)-th line n-th line (n+1)-th line

COLOR SOLID-STATE IMAGER WITH COLOR FILTER HAVING AN OVERLAPPING SEGMENTED FILTER ARRANGEMENT

BACKGROUND OF THE INVENTION

1. Field of the Invention

The present invention relates to an improvement in a solid state color imaging apparatus.

The present invention especially concerns a solid state color imaging apparatus comprising a solid state imaging sensor having a plurality of photoelectric elements disposed in a two-dimensional pattern and is a specially patterned color filter intended to attain high-horizontal resolution, high S/N ratio and simple signal processing.

2. Description of the Prior Art

A solid state image sensor is, as is well known, an apparatus for converting an objective image to an electric signal. A single chip solid state color camera is an apparatus comprising a solid state imaging sensor and color filter with elements of different colors in front of the solid state imaging sensor to obtain an objective image on the surface of the solid state image sensor, which produces a spatially modulated chrominance signal and luminance signal to enable the syntheses of a composite color signal.

On the other hand, the solid state image sensor is a kind of a large scale integrated circuit (LSI), and therefore in order to obtain a high production yield, the degree of the integration of the device should be preferably low. Therefore, the number of the photoelectric elements, disposed in a two dimensional pattern on a substrate, namely, the number of picture elements, should be as small as possible under a condition for attaining a required resolution of the image. Accordingly, the way of producing a chrominance signal should be that which does not lower the theoretical value of the resolution attainable for the number of picture elements. Many proposals have been made for the modes of the pattern combination between the picture elements and the color filter thereof, and the main stream thereof are those using a mosaic color filter.

The problems in the conventional type solid state color imaging apparatus are elucidated referring to FIGS. 1 to 3. FIG. 1 shows a fundamental type apparatus which uses a color filter having filter pattern of vertical color stripes comprising repetition of the three primary colors in a horizontal direction. The apparatus has a solid state image sensor having a number of photoelectric elements, i.e., picture elements 101 disposed forming vertical rows and horizontal lines, and a color filter having vertical color stripes of green filter stripes 102, red filter stripes 103 and blue filter stripes 104 disposed repeatedly in turn. In the signal produced based on sampling by the picture elements of the objective image which is spatially modulated by the color filter stripes, the chrominance signals for colors of the color filter are modulated by respective color filter stripes. In this example, since the spatial repetition period of the filter is for three picture elements length, the carrier frequency of the chrominance signal is one third ($\frac{1}{3}$) of the sampling frequency $f_S$ by the picture elements. In this case, the band-width of the signal of the objective image sampled by the picture elements is a half ($\frac{1}{2}$) of the sampling frequency of the picture elements. In order to avert the undesirable inclusion of the chrominance signal carrier frequency $f_C$ in the luminance signal band, the frequency range usable for the luminance signal band has to be limited to under $\frac{1}{3}f_S$ (one third of the sampling frequency), resulting in a disadvantage of lowering of the horizontal resolution.

FIG. 2 shows another conventional example wherein green filter elements 202 are disposed in a staggered way with respect to the photoelectric picture elements 201 for other picture elements in the n-th line (for instance, odd number lines) R (red) filters 203 are disposed and for other picture elements in the (n+1)-th lines (for instance, even order lines), B (blue) filters 204 are disposed. In this conventional example, by utilizing a green signal for the luminance signal as an approximation and by utilizing vertical correlations of signals, the luminance signal is obtained with a high resolution without the problem as in the conventional example of FIG. 1 where the band width of the luminance signal was limited by the carrier of chrominance signal. However, in this example because the vertical correlation is used, a distortion is produced for an object without vertical correlation thereby lowering picture quality. Also, since the red component and green component signals are generated from the picture elements of the n-th lines and the green component and blue component signals are generated from the (n+1)-th lines, the sum of the signal components differs between even lines and odd lines, thereby vertical non-uniformity or undesirable horizontal stripes is produced when the luminance signal is separated by using only a low-pass filter. Accordingly, the circuit for separating the luminance signal becomes complicated.

Further, there are other conventional examples as shown in FIG. 3. In this example, for a picture element of an n-th line (e.g., odd number line), $\frac{2}{3}$ of the area is covered by a red filter 303 and the remaining $\frac{1}{3}$ area is covered by green filter 305 and in the next picture element in the same horizontal direction, $\frac{2}{3}$ of the area is covered by blue filter 304 and the remaining $\frac{1}{3}$ area is by a green filter, and the same pair repeats in the same order in that line. On the other hand, in the neighboring line of the picture element, i.e. (n+1)-th line (e.g. even number lines), in a picture element which is under a former one of the n-th line, $\frac{2}{3}$ of the area is covered by a blue filter and $\frac{1}{3}$ of the area is covered by a red filter, and in next picture element in the same horizontal line, $\frac{2}{3}$ of the area is covered by G filter and the remaining $\frac{1}{3}$ of the area by a red filter, and such pairs repeat in the horizontal direction in (n+1)-th lines. In this conventional example of FIG. 3(a), luminance signal $S_{Yn}$ for the n-th line and luminance signal $S_{Y(n+1)}$ for the (n+1)-th line are given by the following equations (1) and (2):

$$S_{Yn} = (\tfrac{2}{3}R + \tfrac{1}{3}G) + (\tfrac{2}{3}B + \tfrac{1}{3}G) = \tfrac{1}{3}(R + G + B) \qquad (1)$$

$$S_{Y(n+1)} = (\tfrac{2}{3}B + \tfrac{1}{3}R) + (\tfrac{2}{3}G + \tfrac{1}{3}R) = \tfrac{1}{3}(R + G + B) \qquad (2)$$

In this example, since the components of the luminance signals or n-th lines and (n+1)-th lines have the same contents, the luminance signal can be easily obtained only by taking out through a low-pass filter, without a complicated sampling process as shown in the example of FIG. 2.

However, this conventional example has the difficulty of making the filter so as to be registered with the picture elements in a manner to divide the picture element into $\frac{2}{3}$ areas and $\frac{1}{3}$ areas. Furthermore, in this conventional example, the chrominance signals which are spatially modulated for n-th lines and (n+1)-th lines are given by the following equations (3) and (4), respectively:

$$S_{Cn} = K_1(\tfrac{2}{3}R + \tfrac{1}{3}G) - (\tfrac{2}{3}B + \tfrac{1}{3}G) \sin 2\pi f_C t + = K_1 \tfrac{2}{3}(R-B) \sin 2\pi f_C t + \quad (3),$$

$$S_{C(n+1)} = K_1\{(\tfrac{2}{3}B + \tfrac{1}{3}R) - (\tfrac{2}{3}G + \tfrac{1}{3}R)\} \sin 2\pi f_C t + = K_1 \tfrac{2}{3}(B-G) \sin 2\pi f_C t + \quad (4),$$

where $K_1$ is a constant.

As shown in the equations (3) and (4), the modulated chrominance signals have components of primary color signals in the amounts of $\tfrac{2}{3}$. Accordingly, the S/N ratio is low. As shown in equations (1) and (2), the luminance signals become in the amount of $\tfrac{2}{3}$ of the primary color signals R, G and B. Accordingly the S/N ratios of the luminance signals also are not sufficiently high.

SUMMARY OF THE INVENTION

The present invention purposes to provide a solid state color imaging apparatus having improved luminance level differences between sequences of scanning lines, having improved S/N ratio of the chrominance signal without lowering resolution of the picture which is given by number of picture elements of the solid state image sensor.

According to the present invention, though chrominance signals of respective horizontal lines are read out in time sequence as a color difference signals, the luminance signal can be separated by a simple circuit comprising a low-pass filter without generation of luminance level differences between each sequence of scanning lines, thereby both the luminance signal and chrominance signal are easily processed.

Accordingly, the present invention is suitable for a small type color video camera apparatus having a high resolution and high chrominance S/N ratio.

BRIEF EXPLANATION OF THE DRAWINGS

FIG. 3(b) and FIG. 3(c) are wavelength spectrum diagrams of chrominance signals.

DETAILED DESCRIPTION OF THE PREFERRED EMBODIMENTS

A solid state color imaging apparatus in accordance with the present invention comprises:

a solid state image sensor comprising a plurality of picture elements regularly disposed in two-dimensional patterns, the disposition comprising a plurality of horizontal lines, each having a plurality of picture elements disposed in repetition at a predetermined pitch, a color filter comprising a plurality filter elements disposed in regular repetition in horizontal lines and in vertical rows, which comprises:

a first horizontal line of filter elements for spatially modulating a first color light and a second color light and a second horizontal line of filter elements for spatial modulating the second color light and a third color light, the first horizontal line and the second horizontal lines forming alternate vertical repetitions, and sum of levels of low frequency components of the first line and the second lines being made equal.

For example, said first color light is blue and said second color light is green and said third light is red, and said first horizontal line is, for instance, an odd number of horizontal lines and said second horizontal line is an even number of horizontal lines.

In order to realize the above-mentioned spatial modulations of the chrominance signals, several patterns of filter color dispositions are possible. Hereinafter such filter color arrangements are elucidated in detail referring to embodiments shown in FIG. 4(a) and thereafter.

Figure 4:
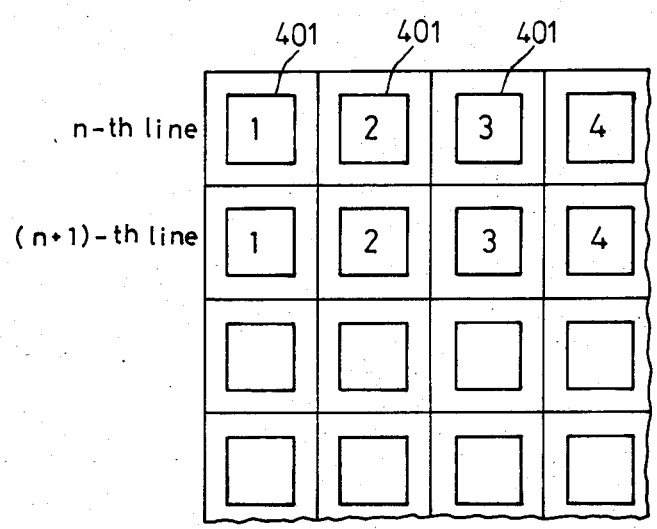
FIG. 4(a) is a front view of the picture elements disposition.
FIG. 4(b) is a front view showing a first example of color filter arrangements to be applied on the picture element disposition of FIG. 4(a).
Figure 4:
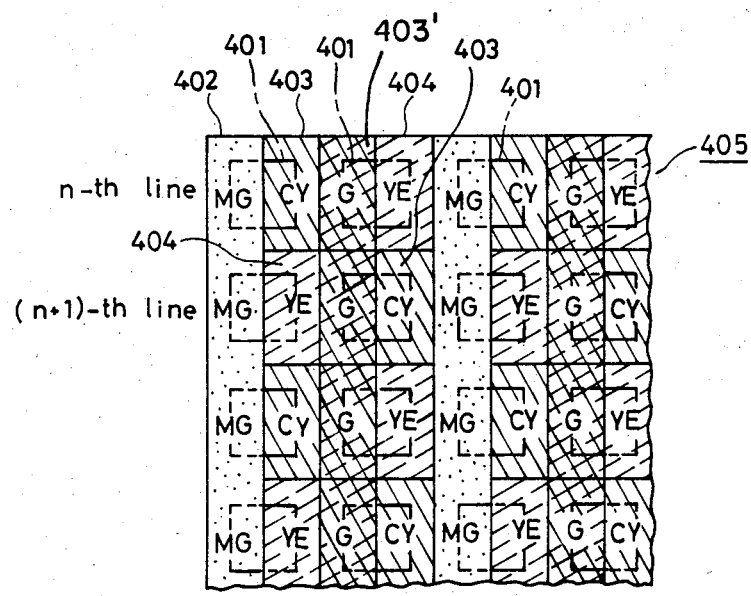

FIG. 4(a) shows a front view of the picture elements disposition of a solid state image sensor wherein the picture elements are disposed regularly in horizontal lines and vertical rows, and hereinafter every other line is referred as the n-th horizonal lines and the other lines, alternately disposed between the above lines, are referred to as the (n+1)-th lines.

Hereinafter, the following abbreviations in capital letters are used to represent intensities of light of colors and filters, and respective abbreviations in small letters are used to represent intensities of electric signals generated by the light of the color incident on the picture elements.

| R  | red     | r  |
|----|---------|----|
| G  | green   | g  |
| B  | blue    | b  |
| MG | magenta | mg |
| CY | cyan    | cy |
| YE | yellow  | ye |

As shown in FIG. 4(b), in n-th line, for instance, odd number lines, a first picture element 401 is divided into two halves with the vertical line around at center. The left half is covered with an MG filter 402 and right half is covered with a CY filter 403. Next for the second picture element is also divided into two parts. The left part is covered with a G filter 403' and its right part is covered with a YE filter 404. The G filter is made by superposing an extended part of the CY filter 403 and the extended part of the YE filter 404. The above-mentioned filter color arrangement is repeated in the same order in the n-th horizontal lines.

In (n+1)-th lines, a left part of a first picture element is covered with an MG filter and its right part is covered with a YE filter, and left part of the second picture element is covered with a G filter and its right part is covered with a CY filter, respectively. This color filter arrangement is repeated in the (n+1)-th lines.

Accordingly, the MG filter and G filter are disposed in vertical stripes and the CY filter and the YE filter are disposed alternatively or staggerdly in vertical rows. A mosaic pattern filter 405 is thus constituted. Apart from the above-mentioned example, the G filters may be formed not by superposition of CY and YE filters but with proper G filters.

By forming the above-mentioned combinations of the picture elements of a solid state sensor and filter pattern, chrominance signals are produced in respective picture elements corresponding to filter color covering them as follows, provided that the photoelectric conversion characteristic of the photodiode in the solid state image sensor is flat for a wavelength range of 400 nm—700 nm: For n-th lines, the sum of the signal outputs (photodiode outputs) corresponding to respective incident light through respective color filters are:

$$\left.\begin{array}{l} \text{through } MG \text{ filter} \ldots \frac{r+b}{2} \\ \text{through } CY \text{ filter} \ldots \frac{g+b}{2} \end{array}\right\} \to \left.\frac{r+b}{2} + \frac{g+b}{2} \right\} \text{(for first picture element)}$$

$$\left.\begin{array}{l} \text{through } G \text{ filter} \ldots \frac{g}{2} \\ \text{through } YE \text{ filter} \ldots \frac{g+r}{2} \end{array}\right\} \to \frac{g}{2} + \frac{g+r}{2} \text{(for second picture element).} \quad (5)$$

Also, for (n+1)-th lines, the sum of signal outputs (photodiode outputs) corresponding to respective incident light through respective color filters are as follows under the same premise as the n-th line on the spectrum characteristic of the photodiodes:

$$\left.\begin{array}{l} \text{through } MG \text{ filter} \ldots \frac{r+b}{2} \\ \text{through } YE \text{ filter} \ldots \frac{g+r}{2} \end{array}\right\} \to \frac{r+b}{2} + \frac{g+r}{2} \text{(for first picture element)}$$

$$\left.\begin{array}{l} \text{through } G \text{ filter} \ldots \frac{g}{2} \\ \text{through } CY \text{ filter} \ldots \frac{g+r}{2} \end{array}\right\} \to \frac{g}{2} + \frac{g+b}{2} \text{(for second picture element).} \quad (6)$$

Accordingly, the signal output $S_{nH}$ for the n-th line and $S_{(n+1)H}$ for the (n+1)-th line are given as follows:

$$S_{nH} = K_1 \left( r + \frac{3}{2} g + b \right) K_2 \left( b - \frac{g}{2} \right) \sin 2\pi f_C t, \quad (7)$$

$$S_{(n+1)H} = K_1 \left( r + \frac{3}{2} g + b \right) + K_2 \left( r - \frac{g}{2} \right) \sin 2\pi f_C t, \quad (8)$$

wherein the second terms represent time sequential change of chrominance signal part and first terms represent mean value, namely the luminance signal part. As is obvious from comparison of the above equations (7) and (8), the low frequency components $S_Y$ of the signal is as follows:

$$S_Y = K_1 \left( r + \frac{3}{2} g + b \right). \quad (9)$$

Accordingly, from the above signal, the luminance signal $S_y$ is obtainable without a luminance level difference between the sequence of scanning lines by simply taking it through a low-pass filter.

The modulated color difference signal is given as an alternating appearance of the belowmentioned components:

$$\left.\begin{array}{l} r - \frac{g}{2} \\ b - \frac{g}{2} \end{array}\right\} \quad (10)$$

Figure 5A:
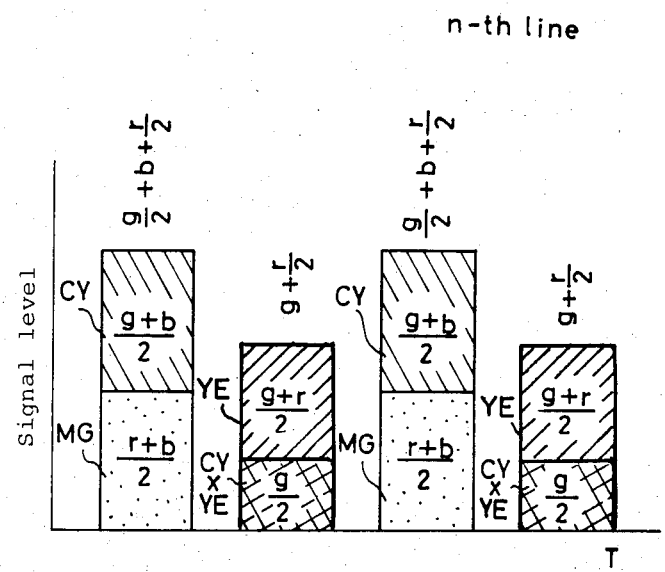
FIG. 5(a) and FIG. 5(b) are time sequential diagrams showing time sequential generations of chrominance signals in the example of FIG. 4(b).
Figure 5B:
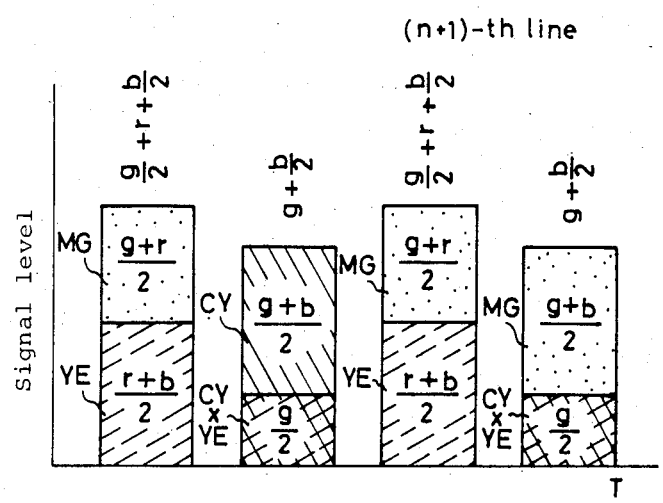
Figure 6:
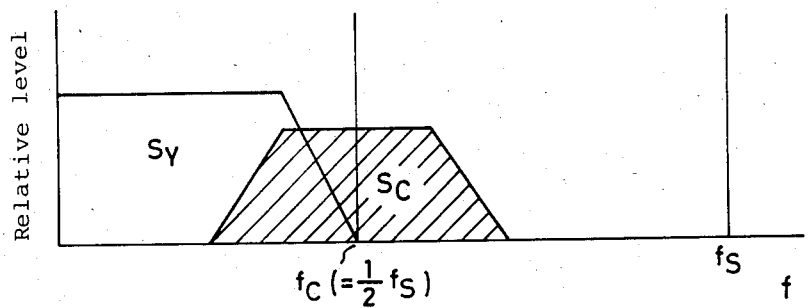
FIG. 6 is a frequency spectrum diagram of the example of FIG. 4(a) and FIG. 4(b).

And the carrier frequency of the modulated chrominance signal is $f_C$, which is ½ of the sampling frequency $f_S$. Accordingly, the band width of the luminance signal $S_y$ can be extended to the theoretical limit of Nyquist's condition. In FIG. 5(a) and FIG. 5(b), the hatched parts show modulated color differential part $S_C$, as shown in FIG. 6.

Figure 7A:
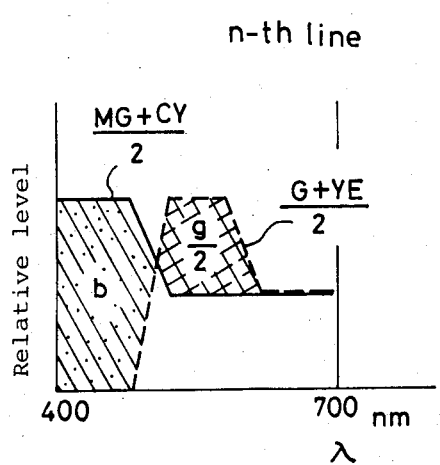
FIG. 7(a) and FIG. 7(b) are schematic wavelength spectrum diagrams of output chrominance signals of the solid state color imaging sensor of FIG. 4(a) and FIG. 4(b).
Figure 7B:
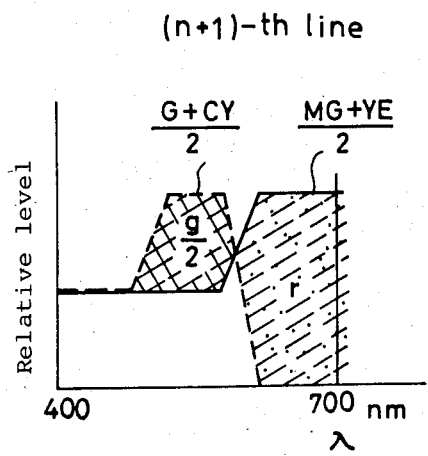
Figure 7:
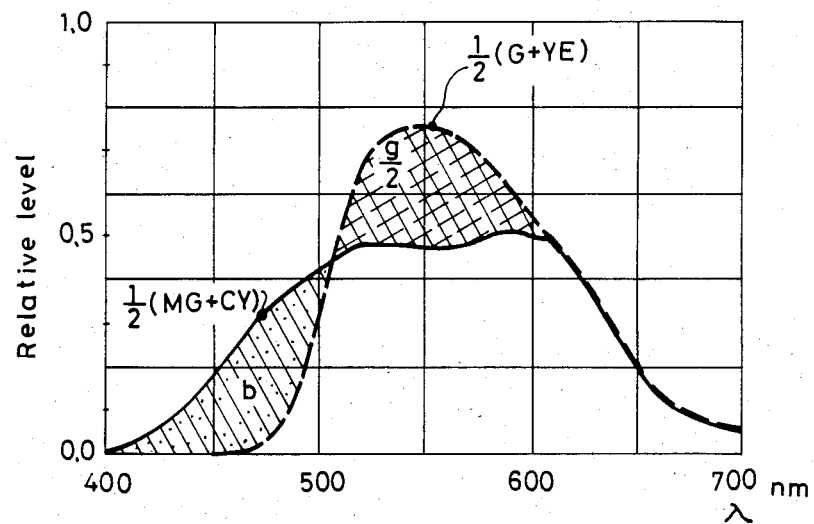
FIG. 7(c) and FIG. 7(d) are wavelength spectrum diagrams of actual examples for the solid state color imaging sensor of FIG. 4(a) and FIG. 4(b).
FIG. 7(e) is an example of a spectral distribution diagram of an overall characteristic of combination of the solid state color imaging sensor of FIG. 4(b) and a representative infrared cut filter.
Figure 7:
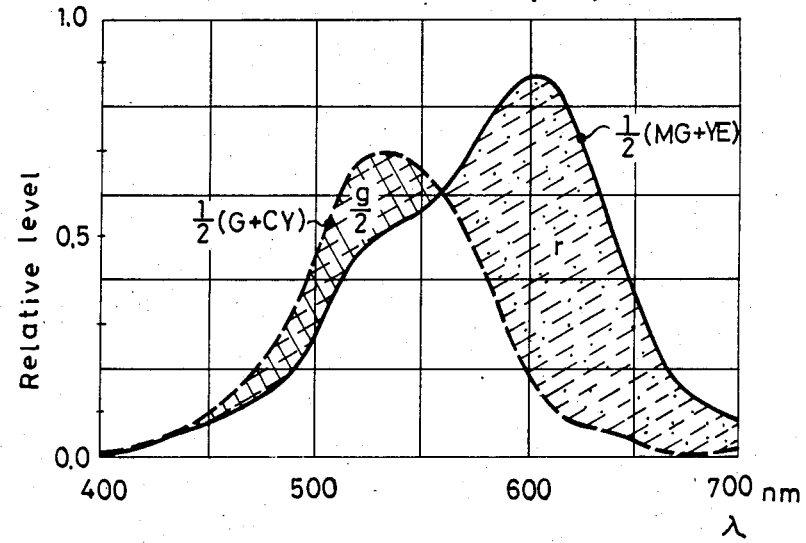
Figure 7:
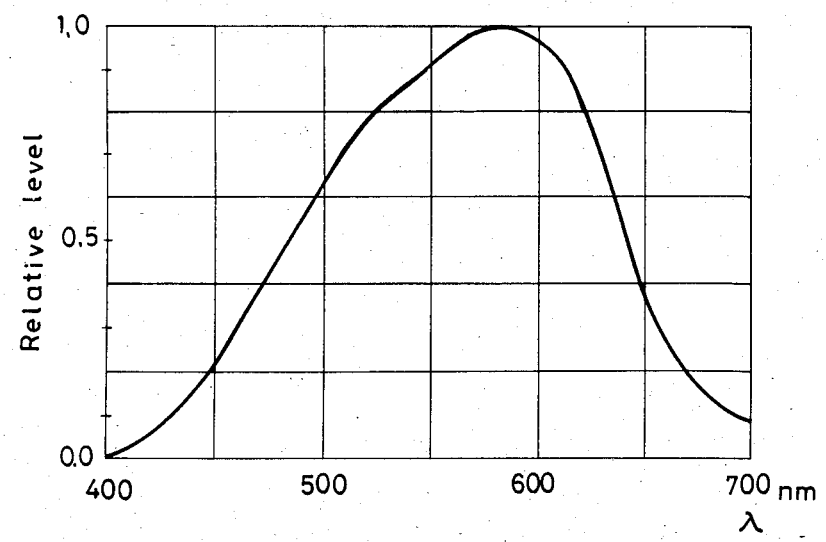

FIG. 7(a) and FIG. 7(b) schematically show spectrum distributions of the respective primary color components of the modulated color difference signals $S_C$, respectively, for the n-th line and (n+1)-th line. In both diagrams, the spectral distributions based on the first picture element is shown by solid lines and the spectral distributions based on the second picture elements are shown by dotted lines.

For the n-th line, the signal level for the first picture element is given by $$\frac{mg + cy}{2}$$

as shown by the solid line in FIG. 7(a), and the signal level for the second picture element is given by $$\frac{g + ye}{2}$$

as shown by the dotted line in FIG. 7(a). Accordingly, a component signal designated by a hatched region b and the other component signal designated by the other hatched region g/2 are modulated with the spatial frequency of the picture element dispositions. Therefore, the modulated signal is given by the term of $$S_{Cn} = K_2 \left( b - \frac{g}{2} \right) \sin \pi 2 f_C t. \tag{11}$$

For the (n+1)-th line, the signal level for the first picture element is given by $$\frac{mg + ye}{2}$$

as shown by the solid line in FIG. 7(b), and the signal level for the second picture element is given by $$\frac{g + cy}{2}$$

as shown by the dotted line in FIG. 7(b). Accordingly, a component signal designated by a hatched region r and the other component signal designated by the other hatched region g/2 are modulated with the spatial frequency of the picture element dispositions. Therefore, the modulated signal is given by the term of $$S_{C(n+1)} = K_2 \left( r - \frac{g}{2} \right) \sin 2\pi f_C t. \tag{12}$$

Though the above-mentioned explanation has been made under a condition that the spectral characteristic of the photoelectric device is flat for the range of 400 nm-700 nm, in an actual solid state imaging sensor, the photoelectric sensitivity extends to the infrared range, and in order to compensate for this, an infrared cut off filter is used. Accordingly, in an actual imaging apparatus provided with the infrared cut filter in front of the photodiode picture elements, the output from the picture elements has the spectral distributions of a product of the spectral characteristic of the solid state imaging sensor itself and the spectral characteristic of the infrared cut filter.

FIG. 7(e) shows one example of the spectral characteristic which is a product of a solid state imaging sensor and infrared cut filter. In the figure, the curve shows that resultant sensitivity decreases on both of red side (600-700 nm) and in blue side (400-500 nm). Accordingly, by obtaining a product of this spectral distribution and the spectral distributions of FIG. 7(a) and FIG. 7(b), the actual spectral distributions for the n-th line and (n+1)-th line are obtained as shown in FIG. 7(c) and FIG. 7(d), respectively, when hatched parts show modulated color differential component parts. In FIG. 7(c), which corresponds to $$\left( b - \frac{g}{2} \right) \sin 2\pi f_C t,$$

components of the blue part b and green part g are substantially of the same amount. In FIG. 7(d) which corresponds to $$\left( r - \frac{g}{2} \right) \sin 2\pi f_C t,$$

the component of red r is larger than that of green g. As has been shown, in the actual solid state color imaging apparatus, the output signal is given as a product of the spectral sensitivity of the solid state imaging sensor, the infrared cut filter spectral characteristic and spectral transparencies of the color mosaic filter. Since the detailed explanation of the present invention does not purpose to discuss in detail the spectral characteristics of the image sensor and infrared filter, for simplicity's sake, hereinafter we provide the product of these characteristics as simply 1 for the range of 400-700 nm. Another result of such an assumption is that the spectral transparency of the color filters are as such used for the output characteristics of the imaging sensor, and the explanation and understandings become easy. Therefore, hereinafter the elucidation is made with the above-mentioned assumption, except for the case where the spectral sensitive characteristic of the imaging sensor, as such, is of problem.

As has been elucidated, amplitudes of chrominance signals to be spatially modulated for an n-th line and (n+1)-th line are $$r - \frac{g}{2} \text{ and } b - \frac{g}{2},$$

respectively, which are different from the color difference signal r−y, b−y in an NTSC TV signal. However, when the obtained color difference signals $$r - \frac{g}{2} \text{ and } b - \frac{g}{2}$$

are balanced-modulated by the sub-carrier, the approximate signal of the modulated color signal of r−y and b−y of the NTSC signal is obtained by varying the phase of the sub-carrier.

Figure 8:
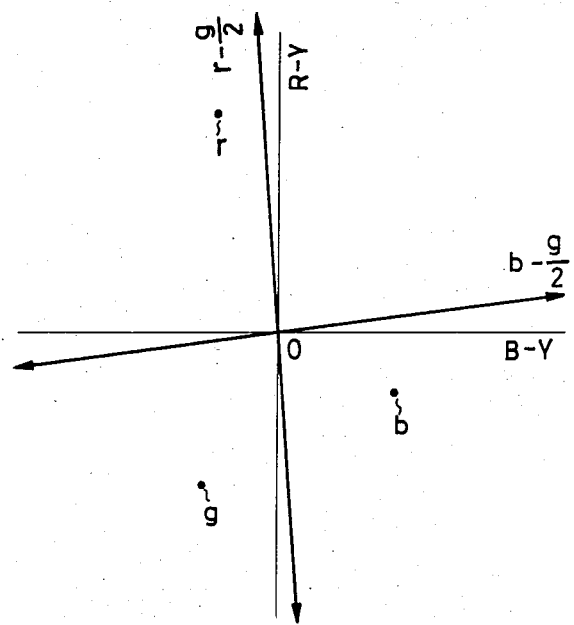
FIG. 8 is diagram showing modulation phase of the r-g/2 signal and b-g/2 signal in a color subscanier.

FIG. 8, shows the phase on which the color difference signals $$r - \frac{g}{2} \text{ and the } b - \frac{g}{2}$$

obtained from the solid color imaging sensor are balanced-modulated by the sub-carrier. The axis of the ordinate corresponds to the phase of the R-Y of the modulation color signal of the NTSC signal and the axis of the abscissa corresponds to the phase of the B-Y of the modulation color signal of the NTSC signal. Further, the reappearing positions (phase and amplitude) of the color difference signal are shown by r, g and b when the primary color object body of red, green and blue is photographed.

Figure 9:
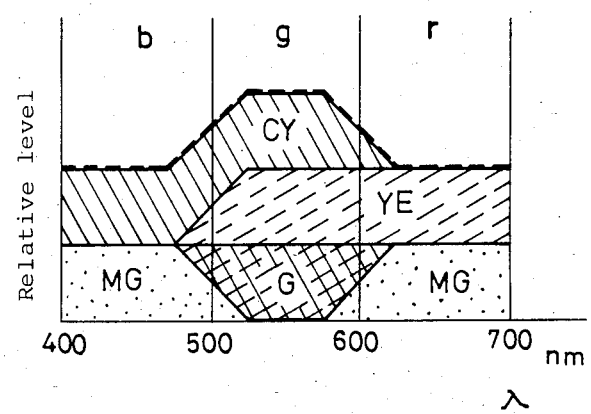
FIG. 9(a) is a schematical wavelength diagram of the luminance signal obtained by the chrominance output signals.
FIG. 9(b) is a spectral distribution diagram of an overall luminance output characteristic of a solid state color imaging sensor with a represenative infrared cut filter.
Figure 9:
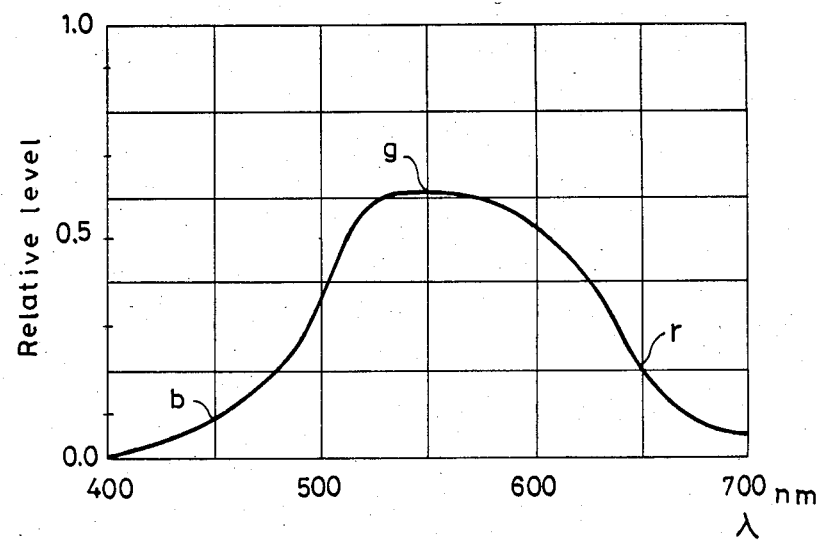

FIG. 9(a) schematically shows overall distribution of component signals of the luminance signal in an actual example, wherein the dotted curve shows the overall spectral characteristic and the hatched area shows component outputs. The sum of the total signal Y is $$Y = r + \frac{3}{2} g + b \quad (13)$$

As shown in FIG. 9(a), the overall spectral distribution is low both in the short wavelength part and the long wavelength part, and the spectral distribution shown in FIG. 9(a) is fairly approximate to the actual components of the luminance signal Y' of NTSC standard which is given by:

$$Y' = 0.30r + 0.59g + 0.11b \quad (14).$$

FIG. 9(b) shows an actual overall spectral characteristic curve of the apparatus, obtained by multiplying the spectral characteristic of FIG. 7(e) for an infrared-cut filter, and the composite spectral characteristic of FIG. 9(a).

Figure 10:
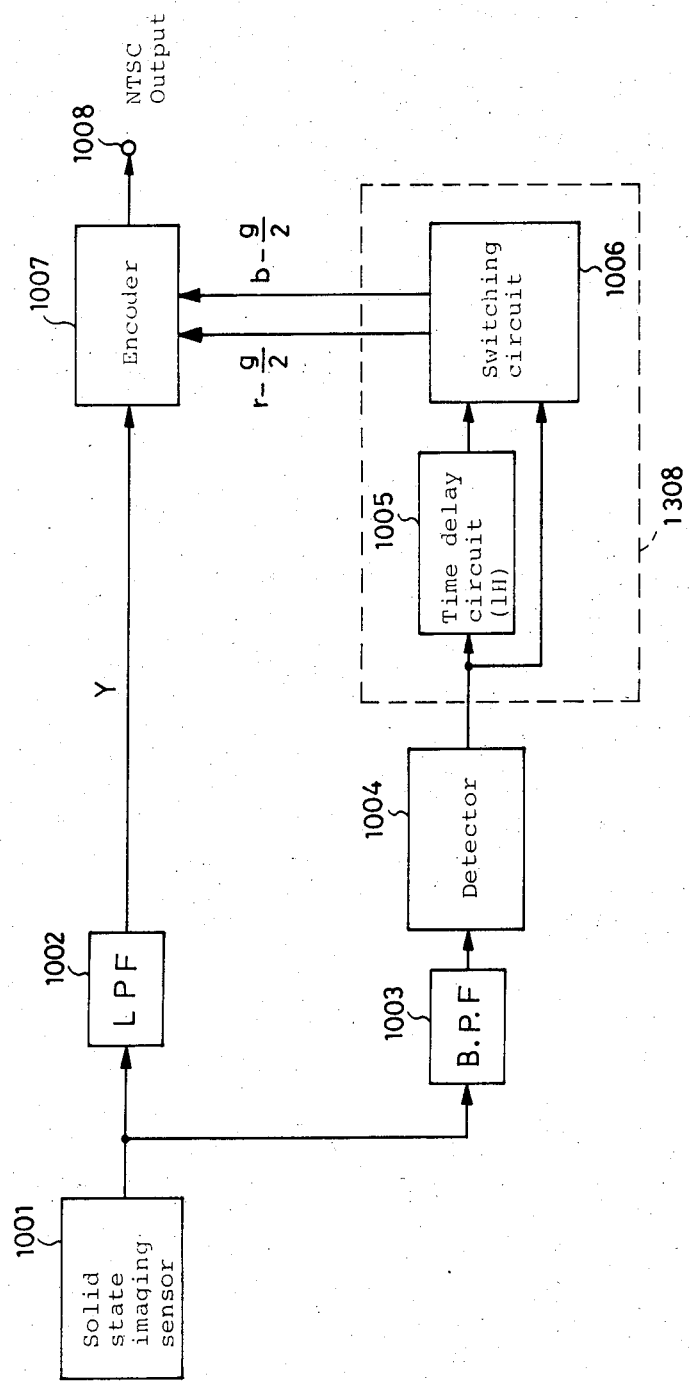
FIG. 10 is a circuit block diagram of an example of a signal processing circuit for producing NTSC output signals from the solid state imaging sensor of FIGS. 4(a)+4(b).

FIG. 10 shows a circuit diagram of one example for processing the above-mentioned signals. In FIG. 10, block 1001 designates the solid state imaging sensor shown in FIG. 4(a) and FIG. 4(b), and its output signal is given to a low-pass filter 1002 having a cut off frequency $f_C$ for separately outputting the luminance signal component Y. On the other hand, the output signal of the solid state imaging sensor 1001 is also given to a band-pass filter 1003 having a center frequency $f_C$ for separately issuing spatially modulated color difference signals and give it to a detection circuit 1004. Then, the detection circuit 1004 issues time sequential color difference signals $$r - \frac{g}{2} \text{ and } b - \frac{g}{2}.$$

Then the time sequential signals are given to a timing adjusting circuit 1308 which comprises one-horizontal-line time delay circuit 1005 and switching circuit 1006 for selectively passing by alternatively switching every horizontal period. The output signals $$r - \frac{g}{2} \text{ and } b - \frac{g}{2}$$

given through the switching circuit 1006 are coupled to encoder 1007 to which the luminance signal Y is also coupled. The encoder 1007 composes a standard NTSC output by processing the three input signals and issues to the output terminal 1008. If the white balance is changed greatly, color difference signals do not become zero, even when a white object is photographed due to some inbalance or dispersion of spectral characteristics of the illumination source or filters. In such case, the inbalance can be compensated by adding or subtracting a part of the luminance signal Y to or from the color difference signals given to the encoder 1007.

As has been elucidated, according to the present invention, the spatial modulated component attributable to the mosaic filter is made in such a manner that in n-th horizontal lines, the signal attributable to a part of the first primary color components (b) and a part of the second primary color components (g/2) are modulated, and in (n+1)-th horizontal lines, the signal attributable to a part of the primary color component (r) and a part of the second primary color component (g/2) are modulated, and that the low frequency component or non-modulated part of the output of the n-th line and (n+1)-th line which comprise the spatially modulated components are made equal to each other. These are the gist of the present invention. In an actual mosaic filter, when it is realized with three color filter elements in the n-th line, (e.g. odd number line) one picture element or plural picture elements equivalent to one (hereinafter, "equivalent picture element" is used to mean both inclusive.) is divided into two segments covered by a first filter element (e.g., MG) and a second (CY) and the horizontally next equivalent picture element is divided into two segments covered with a second filter (e.g. CY) and a third filter (YE). In the second segment, the filter of one segment is made by superposing the two of them. And in the (n+1)-th line, the filter arrangement for the second segment is made opposite in horizontal direction to that of the n-th line.

In the above, the part of the second picture element constituted by superposing two kinds of filters can be replaced by a single filter which has an equivalent characteristic to the superposed filters. The apparatus in accordance with the present invention can provide a color imaging apparatus capable of producing luminance signals having a primary color signal component ratio considerably approximate to the standard NTSC system. And also, the spatial modulation of the color difference signal is large and accordingly, and S/N ratio of the chrominance signal becomes large.

Furthermore, since filter matrixes of horizontal lines are made by using the same kinds of the filter elements, the luminance signal obtained does not have luminance level differences between the sequence of scanning lines even when a correlation circuit is dispenced with.

Furthermore, since the repetition period of the filter arrangement is for two spatial periods of the picture elements, the band-width of luminance signal can be made to ½ of the sampling frequency, accordingly, a high horizontal resolution up to theoretical limit.

Further, since color difference signals having good balance which are close to the ideal spectral characteristic of the luminance signal are achieved, a picture of good color representation is obtainable by using rather simple circuit.

Figure 11A:
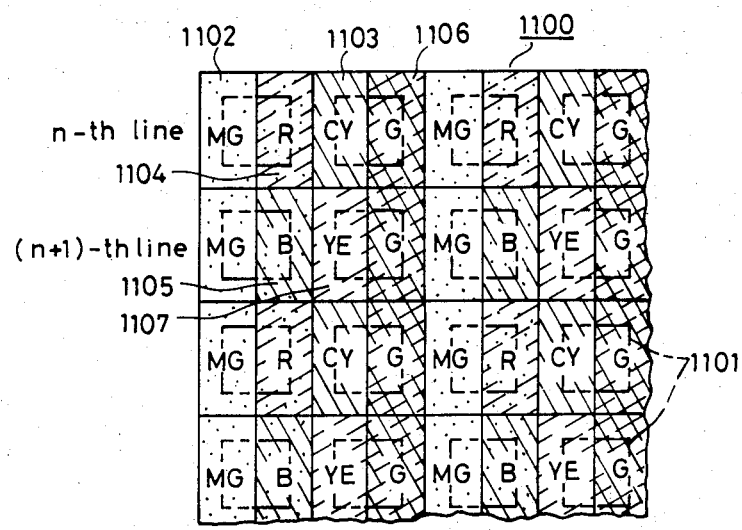
FIG. 11(a) is a front view of another example of a color filter pattern to be applied on a solid state color imaging sensor.

FIG. 11(a) shows a second example in accordance with the present invention having different color filter patterns.

In the example shown in FIG. 11(a), in the similar manner as that of the example of FIG. 4(b), every picture element is divided into two segments by a vertical dividing line and covered with different color filters.

That is, in the example of FIG. 11(a) in the n-th line, for instance, odd number lines, a first picture element 1101 is divided into two parts with the vertical line around at center and the left half is covered with an MG filter 1102, and the right half is covered with an R filter 1104. Next, for the second picture element, for instance, the second picture element is also divided into two parts. The left part is covered with a CY filter 1103 and the right part is covered with a G filter 1106. The G filter can be made by superposing an extended part of the CY filter 1103 and the narrow YE filter 1107. The above-mentioned filter color arrangement is repeated in the same order in the n-th horizontal lines.

In (n+1)-th lines, a left part of a first picture element is covered with an MG filter and its right half part is covered with B filter. And the left part of the second picture element is covered with a YE filter while its right part is covered with a G filter, respectively. This filter arrangement is repeated in the (n+1)-th lines.

Accordingly, the MG filters and G filters are disposed in vertical stripes and the R filter and B filter, as well as the CY filter and YE filter, are arranged making vertically repeating dispositions. Thus a mosaic pattern filter 1100 is constituted. The B filter may be formed by superposing a MG filter and CY filter, and the G filter may be formed by superposing a YE filter and CY filter. Apart from the above-mentioned example, the G filters may be formed not by superposing the CY filter and YE filters, but with proper G filters.

By forming the above-mentioned combinations of the picture elements of a solid state imaging sensor and filter pattern, chrominance signals are produced in respective picture elements corresponding to filter colors covering them as follows, provided that the photoelectric conversion characteristic of the photodiode in the solid state image sensor is flat for a wavelength range of 400 nm—700 nm:

For n-th lines, the sum of signal outputs (photodiode outputs) corresponding to respective incident light through various color filters are:

$$\left.\begin{array}{l} \text{through } MG \text{ filter} \ldots \frac{r+b}{2} \\ \text{through } R \text{ filter} \ldots \frac{r}{2} \end{array}\right\} \frac{r+b}{2} + \frac{r}{2} \text{ (for first picture element)}$$

$$\left.\begin{array}{l} \text{through } CY \text{ filter} \ldots \frac{g+b}{2} \\ \text{through } GE \text{ filter} \ldots \frac{g}{2} \end{array}\right\} \frac{g+b}{2} + \frac{g}{2} \text{ (for second picture element).} \quad (15)$$

Also, for (n+1)-th lines, the sum of the signal outputs (photodiode outputs) corresponding to respective incident light through respective color filters are as follows under the same premise as the n-th line on the spectrum characteristic of the photodiodes:

$$\left.\begin{array}{l} \text{through } MG \text{ filter} \ldots \frac{r+b}{2} \\ \text{through } B \text{ filter} \ldots \frac{b}{2} \end{array}\right\} \frac{r+b}{2} + \frac{b}{2} \text{ (for first picture element)}$$

$$\left.\begin{array}{l} \text{through } YE \text{ filter} \ldots \frac{g+r}{2} \\ \text{through } G \text{ filter} \ldots \frac{g}{2} \end{array}\right\} \frac{g+r}{2} + \frac{g}{2} \text{ (for second picture element).} \quad (16)$$

Figure 11B:
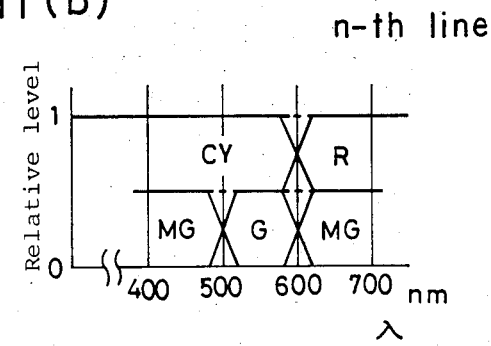
FIG. 11(b) and FIG. 11(c) are schematic spectral distribution diagrams of the example of FIG. 11(a).
Figure 11C:
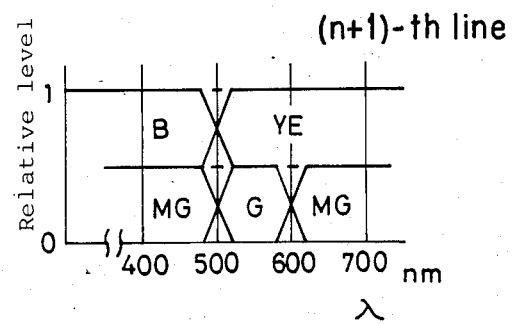
Figure 11:
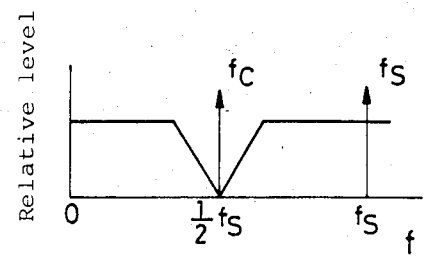
FIG. 11(d) is a schematic frequency spectrum diagram of the example of FIG. 11(a).
FIG. 11(e) and FIG. 11(f) are schematic spectral distribution diagrams of the example of FIG. 11(a).
Figure 11:
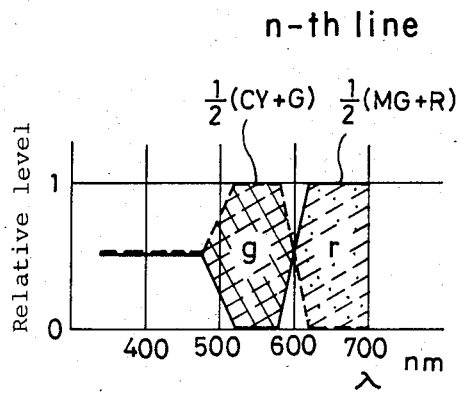
Figure 11:
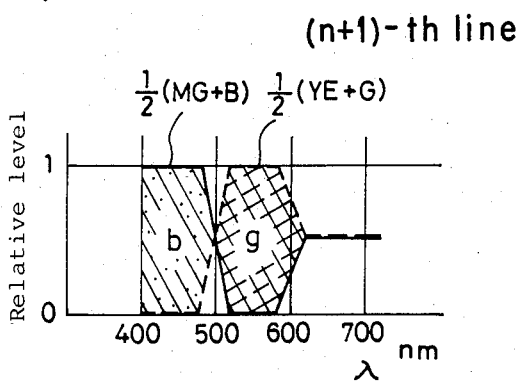

Accordingly, the mean chrominance output $S_{YnH}$ for the n-th line and $S_{Y(n+1)H}$ for the (n+1)-th line are given as follows:

$$S_{YnH} = K_{15}\{\tfrac{1}{2}(MG+R)+\tfrac{1}{2}(CY+G)\} = K_{11}\{\tfrac{1}{2}(r+b+r)+\tfrac{1}{2}(g+b+g)\} = K_{11}(r+g+b) \quad (17)$$

$$S_{Y(n+1)H} = K_{15}\{\tfrac{1}{2}(MG+B)+\tfrac{1}{2}(YE+G)\} = K_{11}\{\tfrac{1}{2}(r+b+b)+\tfrac{1}{2}(g+r+g)\} = K_{11}(r+g+b) \quad (18),$$

where $K_{15}$ and $K_{11}$ are constants. The situation of this is shown in FIG. 11(b) and FIG. 11(c) for n-th lines and (n+1)-th lines, respectively.

That is, since the components of the n-th lines and (n+1)-th lines are equal as is obvious from the above equations, the luminance signal $S_Y$ without the luminance level differences between the sequence of scanning lines are obtainable by simply taking it through a low-pass filter.

Since the horizontal repetition period of color filters is of two picture elements, the carrier $f_C$ of the chrominance signal to be spatially modulated is at $\tfrac{1}{2}f_S$ as shown in FIG. 11(d), and accordingly, the band width of the luminance signal $S_Y$ can be extended to the limit of Nyquist's condition, and a high resolution corresponding to the theoretical limit of the picture element density is attainable.

Next, elucidation is made on chrominance signals. For n-th lines the color difference signal $S_{Ch}$ is given as follows:

$$S_{Cn} = K_{15}\{\tfrac{1}{2}(MG+R)-\tfrac{1}{2}(CY+G)\}\sin 2\pi f_C t + = K_{11}\{\tfrac{1}{2}(r+b+r)-\tfrac{1}{2}(g+b+g)\}\sin 2\pi f_C t + = K_{11}(r-g)\sin 2\pi f_C t + \quad (19).$$

Also, for the (n+1)-th line the color difference signal $S_{C(n+1)}$ is given as follows:

$$S_{C(n+1)} = K_{15}\{\tfrac{1}{2}(MG+B)-\tfrac{1}{2}(YE+G)\}\sin 2\pi f_C t + = K_{11}\{\tfrac{1}{2}(r+b+b)-\tfrac{1}{2}(r+g+g)\}\sin 2\pi f_C t + = K_{11}(b-g)\sin 2\pi f_C t + \quad (20),$$

wherein $K_{15}$ and $K_{11}$ are constants.

Figure 12A:
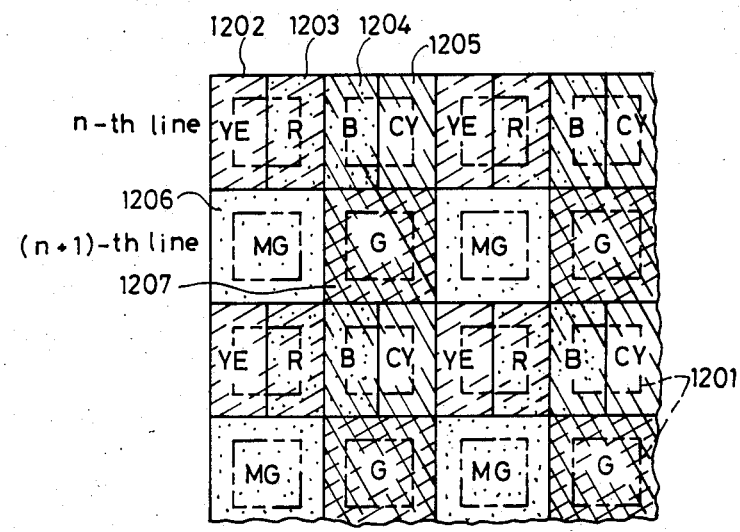
FIG. 12(a) is a front view of a further example of a filter pattern.
Figure 12B:
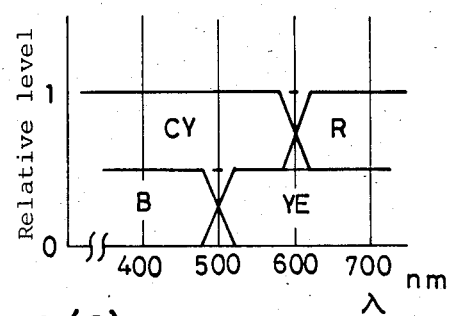
FIG. 12(b) and FIG. 12(c) are schematic spectral distribution diagrams of the example of FIG. 12(a).
Figure 12C:
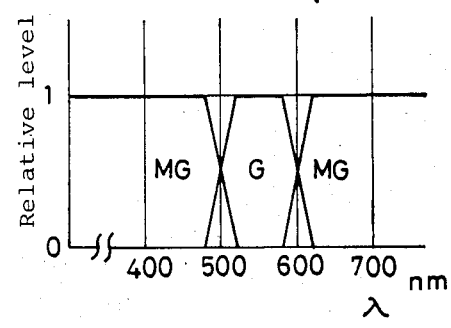
Figure 12:
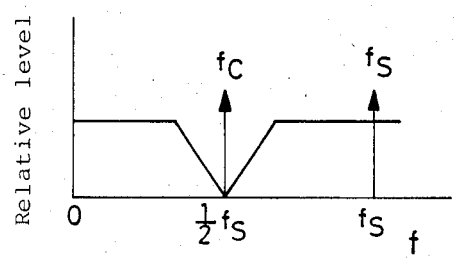
FIG. 12(d) is a schematic frequency spectrum diagram of the example of FIG. 12(a).
FIG. 12(e) and FIG. 12(f) are schematic spectral distribution diagrams of the example of FIG. 12(a).
Figure 12:
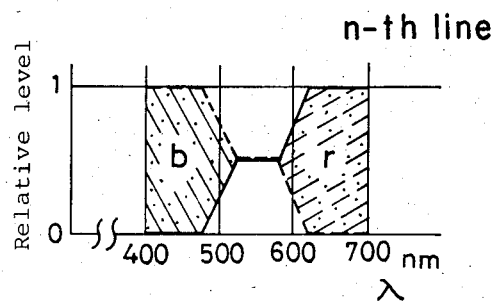
Figure 12:
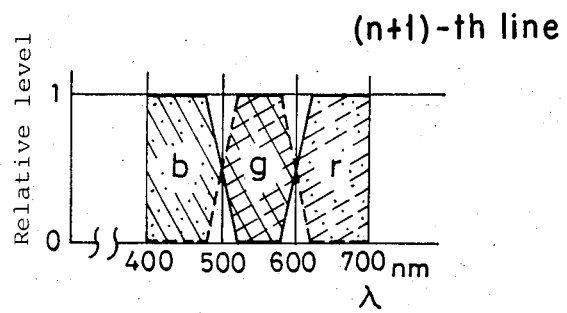

Spatially modulated color difference signals for the n-th line and (n+1)-th line are shown in FIG. 11(e) and FIG. 11(f), respectively. As shown in these figures, the spatially modulated color difference signals for the n-th line is $r-g$ and for the (n+1)-th line is $b-g$, and therefore is larger by 50% than the conventional example of FIG. 3(b) and FIG. 3(c), as is obvious when equations (3) and (4) are compared, and therefore a good S/N ratio is attainable. FIG. 12 shows a further example. In this example, the similar effect as that of the preceding examples of FIG. 4(b) and FIG. 11(a) is obtainable. In FIG. 12(a) in n-th line, the left half part of the picture element is covered with a YE filter and the right part thereof is covered with an R filter, and in the second picture element, the left part is covered with a B filter and its right part is covered with a CY filter. And the same order is repeated in the n-th line. The R filter is constituted by superposing the YE filter and MG filter, and the B filter is constituted by superposing the CY filter and the MG filter.

Then, for (n+1)-th line, the whole part of the first picture element is covered with MG filter, and the whole part of the second picture element is covered with G filter. This pair of MG and G filter is repeated in the (n+1)-th line. The G filter is constituted by superposing the YE filter and CY filter. And the n-th and (n+1)-th line are alternately disposed in a vertical direction so that mosaic filter pattern as the FIG. 12(a) is constituted. In this mosaic filter pattern, in the similar way as shown in FIG. 11(a), the sum of the signal becomes substantially flat and equal for the n-th line and the (n+1)-th line as shown by FIG. 12(b) and FIG. 12(c), respectively. Accordingly, by using a further simple low-pass filter, the luminance signal can be separated without making luminance level differences between sequence of scanning lines, since there is no difference between the sum of the signal between the alternate horizontal lines. Furthermore, since the periods of horizontal repetition of the color filters is for two picture elements width, the carrier frequency $f_C$ of the chrominance signal generated by spatial modulation by the color filters become a half ($\frac{1}{2}$) of the sampling frequency $f_S$ by the picture elements. Accordingly, the band width of the luminance signal can be extended to the frequency of $\frac{1}{2}f_S$, and accordingly, the horizontal resolution can be raised to a theoretical value decided by the horizontal density of the picture elements.

For color difference signals, a large output is obtainable like the example of FIG. 11(a) as follows. That is for n-th line the color difference signal $S_{Ch}$ is given by $$S_{Cn}=K_{15}\{\tfrac{1}{2}(YE+R)-\tfrac{1}{2}(B+CY)\} \sin 2\pi f_C t + = K_{11}\{\tfrac{1}{2}(r+g+r)-\tfrac{1}{2}(b+g+b)\} \sin 2\pi f_C t + = K_{11}(r-b) \sin 2\pi f_C t + \quad (21).$$

And for the (n+1)-th line, the color difference signal $S_{C(n+1)}$ is given by the following equation:

$$S_{C(n+1)}=K_{15}(MG-G) \sin 2\pi f_C t + = K_{11}(r+b-g) \sin 2\pi f_C t = \quad (22).$$

The above-mentioned color difference signals are represented in FIG. 12(e) for n-th lines, and in FIG. 12(f) for (n+1)-th lines, respectively.

Figure 1A:
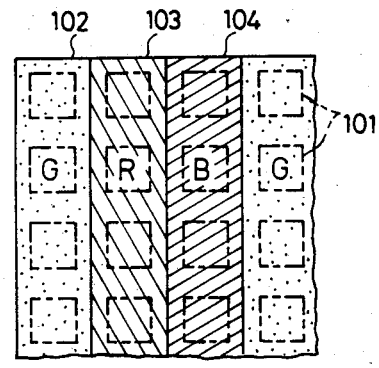
FIG. 1(a) is a front view of a first conventional example of a solid state color imaging sensor.
Figure 1B:
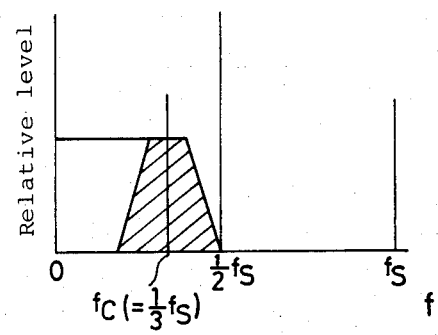
FIG. 1(b) is the frequency spectrum diagram of the conventional example of FIG. 1(a).
Figure 2A:
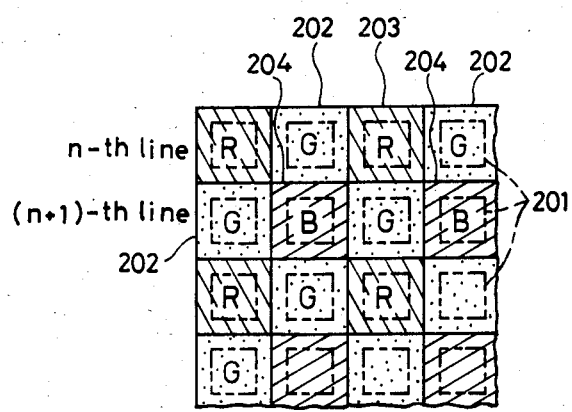
FIG. 2(a) is the front view of the second conventional example of a solid state color imaging sensor.
Figure 2B:
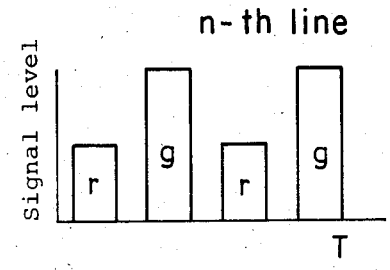
FIG. 2(b) and FIG. 2(c) are time charts showing time sequential generations of respective primary color signals of the example of FIG. 2(a).
Figure 2C:
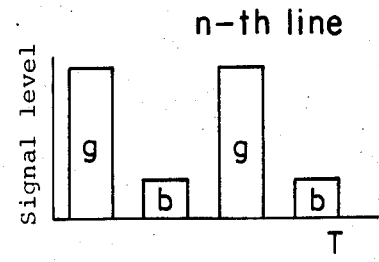
Figure 3A:
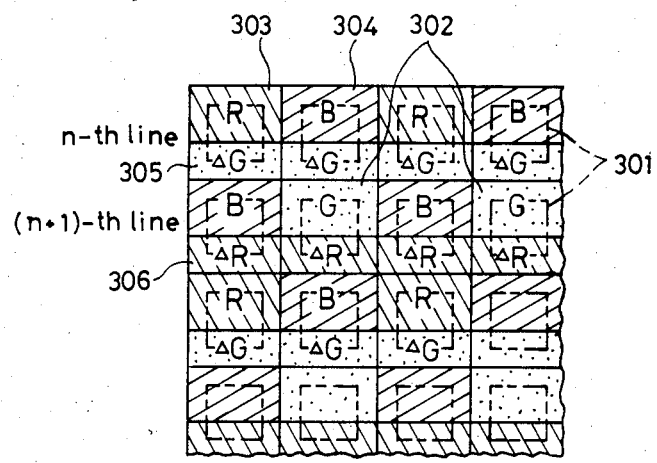
FIG. 3(a) shows the front view of the third conventional example of a solid state color imaging sensor.
Figure 3A:
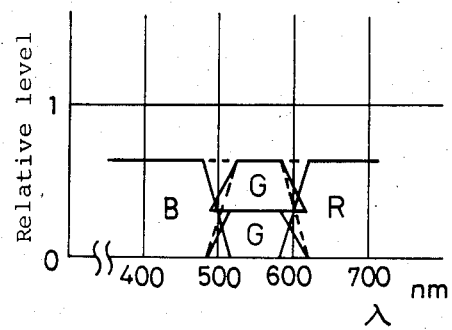
Figure 3A:
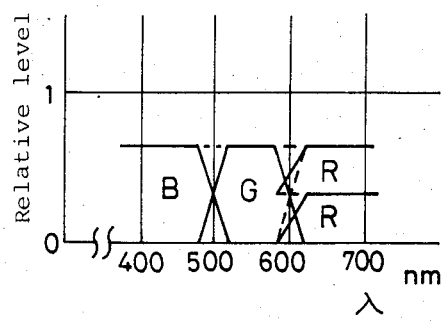

That is, as shown in FIG. 12(e) and FIG. 12(f), the present example can produce a larger output signal in comparison with the conventional example shown in FIG. 3(a) and accordingly, an apparatus of good S/N ratio is obtainable.

Figure 13:
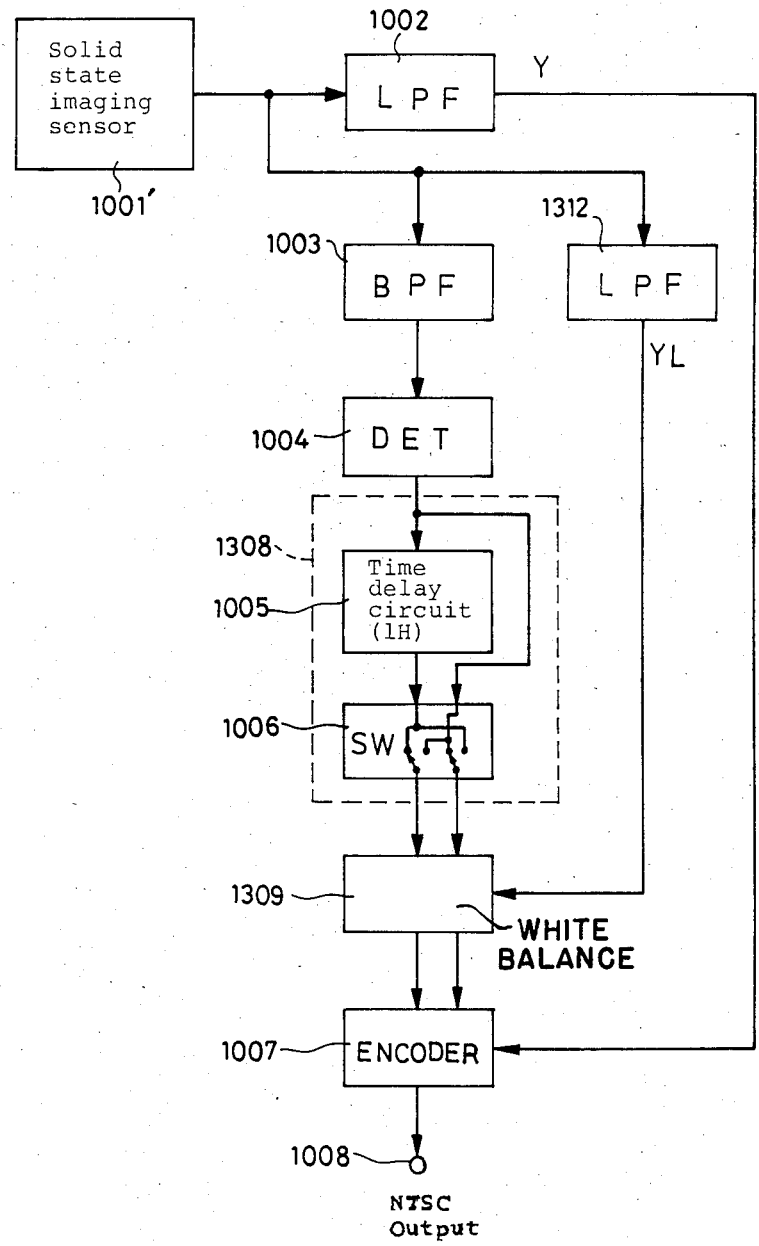
FIG. 13 is a circuit block diagram of one example for producing NTSC output signals from the chrominance signals of the solid state color imaging sensor of FIG. 11(a) or FIG. 12(a).

FIG. 13 shows one example of a circuit diagram for processing signals for the solid state imaging sensor of FIG. 11(a) and FIG. 12(a). In FIG. 13, the output signal from the solid state imaging sensor 1001' is given to a first low-pass filter 1002, a second low-pass filter 1312 and a band-pass filter 1003. Then to the band-pass filter 1003, the modulated color difference signal is given to a detector 1004, which issues detected output signals to time adjusting circuit 1308 which comprises one horizontal period delay circuit 1005 and selection switch 1006. The output signal of the selection switch 1006 are given to white balancer 1309 to which output signal from the second low-pass filter 1312 is also given as a reference signal. Then output signals of the white balancer 1309 and luminance signal Y from the low-pass filter 1002 are given to an encoder 1007 which synthesizes a known standard NTSC signal and outputs it to the output terminal 1008.

As has been elucidated with reference to the preferred embodiments, the solid state color imaging apparatus in accordance with the present invention a can produce luminance signal which has information of high resolution as theoretically given corresponding to the number of picture elements. And further, only by employing a low-pass filter, the luminance signal is easily separated luminance level differences between sequence of scanning lines.

Furthermore, concerning the chrominance signal, the amount of color difference signal to be spatially modulated is larger than those of the conventional apparatus. Accordingly, the solid state color imaging apparatus in accordance with the present invention has a higher S/N ratio. Further, because the chrominance signal is given as color difference signals for every lines, the circuit configuration for processing the chrominance signal can be made simpler. Accordingly, the present apparatuses are suitable for small type solid state color imaging apparatus.

What is claimed is:

1. A solid-state color imaging apparatus comprising:
   a solid-state image sensor comprising a plurality of picture elements regularly disposed in a two-dimensional pattern comprising a plurality of horizontal lines, each line having a plurality of picture elements disposed in repetition at a predetermined pitch, said picture elements converting incident light into an output signal which corresponds to the amount of said incident light at a predetermined time and each of said elements outputting said output signal in order when scanned; and
   a color filter comprising a plurality of filter elements disposed in regular repetition in horizontal lines and in vertical columns, including first horizontal lines in which first equivalent filter elements for transmitting at least a first color light and second equivalent filter elements for transmitting at least a second color light are alternately and sequentially disposed, and second horizontal lines in which third equivalent filter elements for transmitting at least said second color light and fourth equivalent filter elements for transmitting at least a third color light are alternately and sequentially disposed;
   said first horizontal lines and said second horizontal lines being alternately and sequentially disposed in a vertical direction thereby forming a two-dimensional mosaic filter pattern; wherein
   said filter elements are selected such that the mean value of the output signals of two neighboring picture elements in horizontal lines of said solid-state image sensor under said first horizontal lines of said color filter and the mean value of the output signals of two neighboring picture elements in horizontal lines of said solid-state image sensor under said second horizontal lines of said color filter are substantially equal, said mean values of said output signals containing modulated color-difference components which are determined by the transmitting characteristics of said filter elements and which represent different combinations of at least two of said color lights;
   in said first horizontal lines, said first equivalent filter elements each covering one of said plurality of picture elements of said solid-state image sensor and each being divided into two segments wherein one of the segments is covered with a first type of filter element and the other segment is covered with a second type of filter element, thereby forming a plurality of first segmented filter elements, and said second equivalent filter elements each covering one of said plurality of picture elements of said solid-state image sensor and each being wholly covered with a third type of filter element and half of each of said second equivalent filter elements being further covered with said second type of filter element, thereby forming a plurality of second segmented filter elements, the above filter disposition being repeated in said first horizontal lines; and in said second horizontal lines, said third equivalent filter elements being disposed immediately adjacent to corresponding ones of said first equivalent picture elements in said first horizontal lines with each of said third equivalent filter elements covering one of said plurality of picture elements of said solid-state image sensor and each being divided into two segments wherein one of the segments is covered with said first type of filter element and the other segment is covered with said third type of filter element, thereby forming a plurality of third segmented filter elements, and said fourth equivalent filter elements each covering one of said plurality of picture elements of said solid-state image sensor and each being wholly covered with said second type of filter element and half of each of said fourth equivalent filter elements being further covered with said third type of filter element, thereby forming a plurality of fourth segmented filter elements, the above filter disposition being repeated in said second horizontal lines.

2. A solid-state color imaging apparatus in accordance with claim 1, wherein
said first type of filter element is a magenta filter,
said second type of filter element is a cyan filter, and
said third type of filter element is a yellow filter.

3. A solid-state color imaging apparatus comprising:
a solid-state image sensor comprising a plurality of picture elements regularly disposed in a two-dimensional pattern comprising a plurality of horizontal lines, each line having a plurality of picture elements disposed in repetition at a predetermined pitch, said picture elements converting incident light into an output signal which corresponds to the amount of said incident light at a predetermined time and each of said elements outputting said output signal in order when scanned; and
a color filter comprising a plurality of filter elements disposed in regular repetition in horizontal lines and in vertical columns including first horizontal lines in which first equivalent filter elements for transmitting at least a first color light and second equivalent filter elements for transmitting at least a second color light are alternately and sequentially disposed, and second horizontal lines in which third equivalent filter elements for transmitting at least said second color light and fourth equivalent filter elements for transmitting at least a third color light are alternately and sequentially disposed;
said first horizontal lines and said second horizontal lines being alternately and sequentially disposed in a vertical direction thereby forming a two-dimensional mosaic filter pattern; wherein
said filter elements are selected such that the mean value of the output signals of two neighboring picture elements in horizontal lines of said solid-state image sensor under said first horizontal lines of said color filter and the mean value of the output signals of two neighboring picture elements in horizontal lines of said solid-state image sensor under said second horizontal lines of said color filter are substantially equal, said mean values of said output signals containing modulated color-difference components which are determined by transmitting characteristics of said filter elements and which represent different combinations of at least two of said color lights;

in said first horizontal lines, said first equivalent filter elements each covering one of said plurality of picture elements of said solid-state image sensor and each being wholly covered with a first type of filter element and half of each of said first equivalent picture elements being further covered with a second type of filter element, thereby forming a plurality of first segmented filter elements, and said second equivalent filter elements each covering one of said plurality of picture elements of said solid-state image sensor and each being wholly covered with a third type of filter element and half of each of said second equivalent filter elements being further covered with said second type of filter element, thereby forming a plurality of second segmented filter elements, the above filter disposition being repeated in said first horizontal lines; and in said second horizontal lines, said third equivalent filter elements being disposed immediately adjacent to corresponding ones of said first equivalent filter elements in said first horizontal lines with each of said third equivalent filter elements covering one of said plurality of picture elements of said solid-state image sensor and each being wholly covered with said first type of filter element and half of each of said third equivalent filter elements being further covered with said third type of filter element, thereby forming a plurality of third segmented filter elements, and said fourth equivalent filter elements each covering one of said plurality of picture elements of said solid-state image sensor and each being wholly covered with said second type of filter element and half of each of said fourth equivalent filter elements being further covered with said third type of filter element, thereby forming a plurality of fourth segmented filter elements, the above filter disposition being repeated in said second horizontal lines.

4. A solid-state color imaging apparatus in accordance with claim 3, wherein
said first type of filter element is a magenta filter,
said second type of filter element is a yellow filter, and
said third type of filter element is a cyan filter.

5. A solid-state color imaging apparatus comprising:
a solid-state image sensor comprising a plurality of picture elements regularly disposed in a two-dimensional pattern comprising a plurality of horizontal lines, each line having a plurality of picture elements disposed in repetition at a predetermined pitch, said picture elements converting incident light into an output signal which corresponds to the amount of said incident light at a predetermined time and each of said elements outputting said output signal in order when scanned; and
a color filter comprising a plurality of filter elements disposed in regular repetition in horizontal lines and in vertical columns, including first horizontal lines in which first equivalent filter elements for transmitting at least a first color light and second equivalent filter elements for transmitting at least a second color light are alternately and sequentially disposed, and second horizontal lines in which third equivalent filter elements for transmitting at least said second color light and fourth equivalent filter elements for transmitting at least a third color light are alternately and sequentially disposed;

said first horizontal lines and said second horizontal lines being alternately and sequentially disposed in a vertical direction thereby forming a two-dimensional mosaic filter pattern; wherein said filter elements are selected such that the mean value of the output signals of two neighboring picture elements in horizontal lines of said solid-state image sensor under said first horizontal lines of said color filter and the mean value of the output signals of two neighboring picture elements in horizontal lines of said solid-state image sensor under said second horizontal lines of said color filter are substantially equal, said mean values of said output signals containing modulated color-difference components which are determined by the transmitting characteristics of said filter elements and which represent different combinations of at least two of said color lights;

in said first horizontal lines, said first equivalent filter elements each covering one of said plurality of picture elements of said solid-state image sensor and each being wholly covered with a first type of filter element and half of each of said first equivalent filter elements being further covered with a second type of filter element, thereby forming a plurality of first segmented filter elements, and said second equivalent filter elements each covering one of said plurality of picture elements of said solid-state image sensor and each being wholly covered with a third type of filter element and half of each of said second equivalent filter elements being further covered with said second type of filter element, thereby forming a plurality of second segmented filter elements, the above filter disposition being repeated in said first horizontal lines; and in said second horizontal lines, said third equivalent filter elements being disposed immediately adjacent to corresponding ones of said first equivalent filter elements in said first horizontal lines with each of said third equivalent filter elements covering one of said plurality of picture elements of said solid-state image sensor and each being wholly covered with said second type of filter element, and said fourth equivalent filter elements each covering one of said plurality of picture elements of said solid-state image sensor and each being wholly covered with said first type of filter element and said fourth equivalent filter elements each being further wholly covered by said third type of filter element, the above filter disposition being repeated in said second horizontal lines.

6. A solid-state color imaging apparatus in accordance with claim 5, wherein said first type of filter element is a yellow filter,
said second type of filter element is a magenta filter, and
said third type of filter element is a cyan filter.

* * * * *